(12) United States Patent
Väisänen (10) Patent No.: US 7,288,995 B2
(45) Date of Patent: Oct. 30, 2007

(54) POWER AMPLIFIER OF A TRANSMITTER (75) Inventor: Risto Väisänen, Salo (FI)

(73) Assignee: Nokia Corporation, Espoo (FI)

( * ) Notice: Subject to any disclaimer, the term of this patent is extended or adjusted under 35 U.S.C. 154(b) by 110 days.

(21) Appl. No.: 11/154,933

(22) Filed: Jun. 15, 2005

(65) Prior Publication Data

US 2006/0284685 A1    Dec. 21, 2006

(51) Int. Cl.
*H03F 3/04* (2006.01)
(52) U.S. Cl. ...................... 330/302; 330/307
(58) Field of Classification Search .............. 330/302, 330/303, 305, 306, 307
See application file for complete search history.

(56) References Cited

U.S. PATENT DOCUMENTS 5,973,567 A    10/1999    Heal et al.
6,384,688 B1 *    5/2002    Fujioka et al. .............. 330/302
6,396,348 B1 *    5/2002    Honjo ........................ 330/286
6,552,610 B1 *    4/2003    Grebennikov et al. ...... 330/251

FOREIGN PATENT DOCUMENTS

DE    10152652    4/2003
EP    1578014    9/2005

* cited by examiner

*Primary Examiner*—Henry Choe
(74) *Attorney, Agent, or Firm*—Alfred A. Fressola; Ware, Fressola, Van Der Sluys & Adolphson (57) ABSTRACT

A power amplifier integrated into an RF-IC (integrated circuit carrying radio frequency signals) comprises an active stage (350) and a passive stage (360), the passive stage being electrically coupled between the active stage and a load of the power amplifier. Electrically conductive elements (305) accomplishing an electrical connection between the active part and the passive part of an RF-IC are designed in a way that the electrically conductive elements perform at least part of impedance transformation on a signal path from signal output terminals of the active stage to signal output terminals of the passive stage.

44 Claims, 8 Drawing Sheets

POWER AMPLIFIER OF A TRANSMITTER

TECHNICAL FIELD

The invention concerns the field of transmitter power amplifiers for radio frequency signals. Especially the invention concerns a power amplifier integrated into an integrated circuit carrying radio frequency signals.

BACKGROUND OF THE INVENTION

In this document the following abbreviations are used when describing the prior art and also when describing the present invention:
Balun Balanced to unbalanced transformer,
FR4 Base material for printed circuit boards (FR=Flame Retardant, and Type "4" indicates woven glass reinforced epoxy resin),
IC integrated circuit,
RF radio frequency, One of the basic tasks in RF-technology is amplification of RF-signals with sufficient bandwidth, with a desired gain, and with sufficient linearity. Also the fact that power losses are sufficiently small is an important issue especially in mobile phone applications. The current tendency is towards smaller systems with respect to physical size, weight, and power consumption. This means that various types of electrical elements handling also analogue RF-signals are included into integrated circuits.

Figure 1:
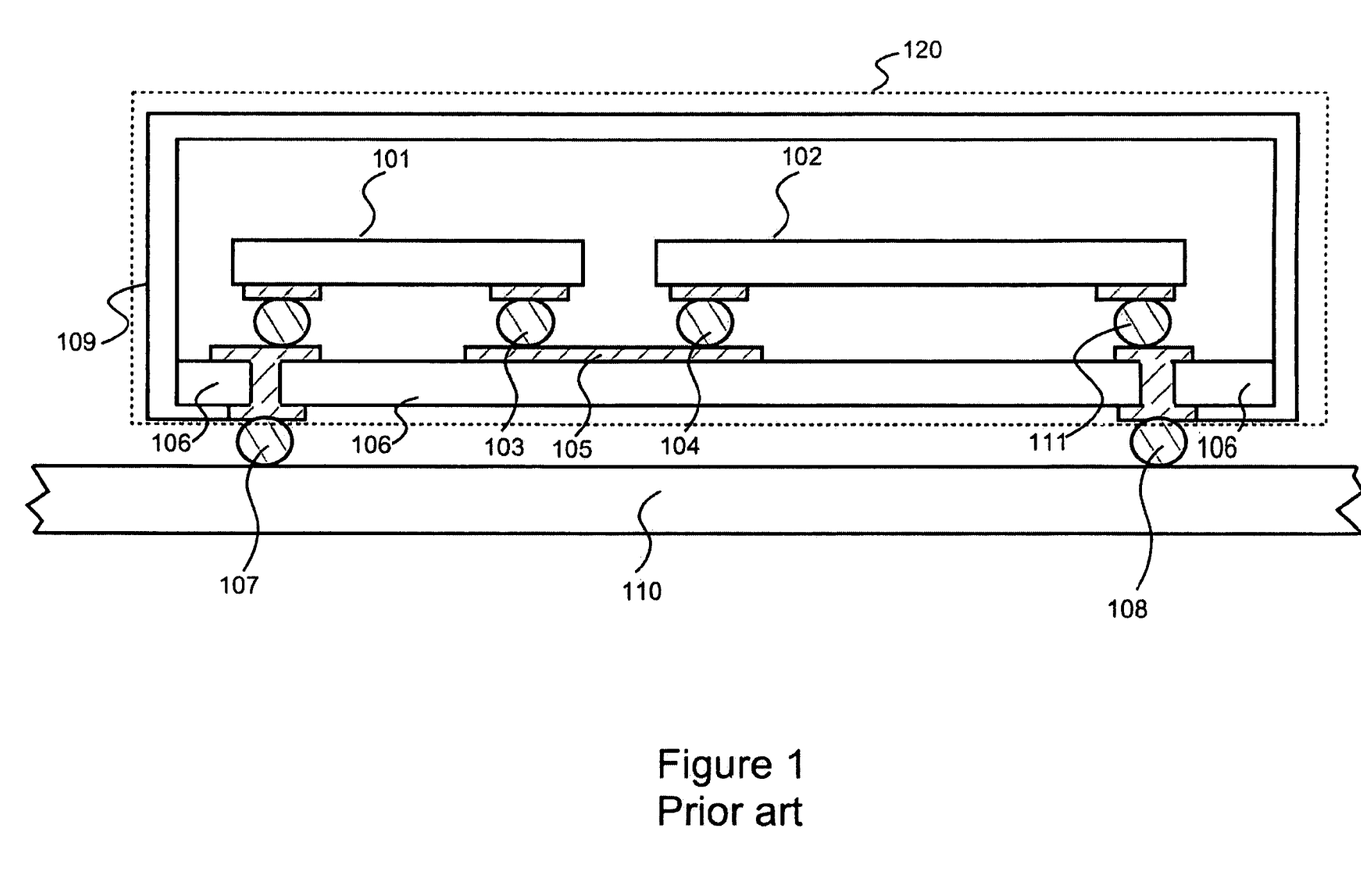
FIG. 1 is a schematic side view of a construction of an integrated RF-circuit.

A generally used construction for RF-integrated circuits (RF-IC) having both active electrical elements and low-loss passive electrical elements is such that the active elements have been integrated into a first part of an RF-IC and the passive elements into a second part of an RF-IC. In the continuation of this document the first part and the second part are referred as 'the active part' and 'the passive part', respectively. The body of the active part may be made, for example, of silicon and the body of the low-loss passive part may be made, for example, of glass. A side view of an exemplary system of this kind is illustrated in FIG. 1. The active part 101 and the passive part 102 are electrically connected with each other via electrically conductive solder bumps 103, 104 and via electrically conductive areas 105 on the base plate 106, i.e. the flip-chip technique. It is also possible to accomplish said electrical connections using some other techniques like e.g. wire bonding. The base plate 106 may be made, for example, of FR4. This whole system may be encased into e.g. a plastic package 109. In this document a system 120 consisted of the parts inside the package 109 plus the package 109 itself is called an RF-IC. The RF-IC is connected with a circuit board 110 (a fraction of that shown in FIG. 1) via solder bumps 107 and 108.

DESCRIPTION OF THE PRIOR ART

A broadband power amplifier for RF-signals can be a single-sided amplifier or a two-sided amplifier. There are two different basic forms of two-sided amplifiers. One of them is a push-pull type differential amplifier in which two amplifier sides are controlled in a way that output signals of the sides are in opposite phases. Another type of a two-sided amplifier is such that output signal of one amplifier side is delayed with respect to output signal of another amplifier side in a way that there is a 90 degrees phase difference at a centre frequency of a signal band.

In a power amplifier a signal output of an active stage is electrically coupled with a load through a passive stage. The passive stage can comprise among others a low-pass filter. The load can be, for example, an antenna of a mobile phone.

In a single-ended amplifier an output impedance of an active stage, i.e. the impedance seen between output terminal of an output transistor and a signal ground, is low, in the order of few ohms. This impedance level is too low for electrical systems comprised by the passive stage, e.g. a low-pass filter. This mismatch between the impedances causes a need for impedance transformation. In order to minimize resistive losses in the impedance transformation an impedance transformer is preferably a multi-stage electrical circuit. Therefore, the number of electrical components in an impedance transformer is relatively high. Many times the electrical components have to be realized as discrete components meaning also an increase in the number of components to be assembled in a production line. Briefly speaking the electrical components mean costs, a need for space, and power losses.

In a two-sided amplifier with a 90 degrees phase shift differently phased signals are combined in a passive stage in a so-called 3 dB hybrid circuit, one output of which is terminated with a terminating impedance while the other output is coupled through a low-pass filter to a load, e.g. an antenna. Output impedance of a two-sided active stage, i.e. the impedance seen between output terminals of output transistors of the active stage towards the transistors, is low, in the order of few ohms. This impedance level is too low for electrical systems comprised by the passive stage. The input impedance of the hybrid circuit is significantly higher. This mismatch between the impedances of the hybrid circuit and of the two-sided active stage causes a need for impedance transformation. The electrical components needed for the impedance transformation mean costs, a need for space, and power losses.

In a text below a more detailed analysis is given for a push-pull type differential amplifier. A person skilled to art may, naturally, perform a similar more detailed analysis for a single-sided amplifier and for a two-sided amplifier with a 90 degrees phase shift.

Figure 2:
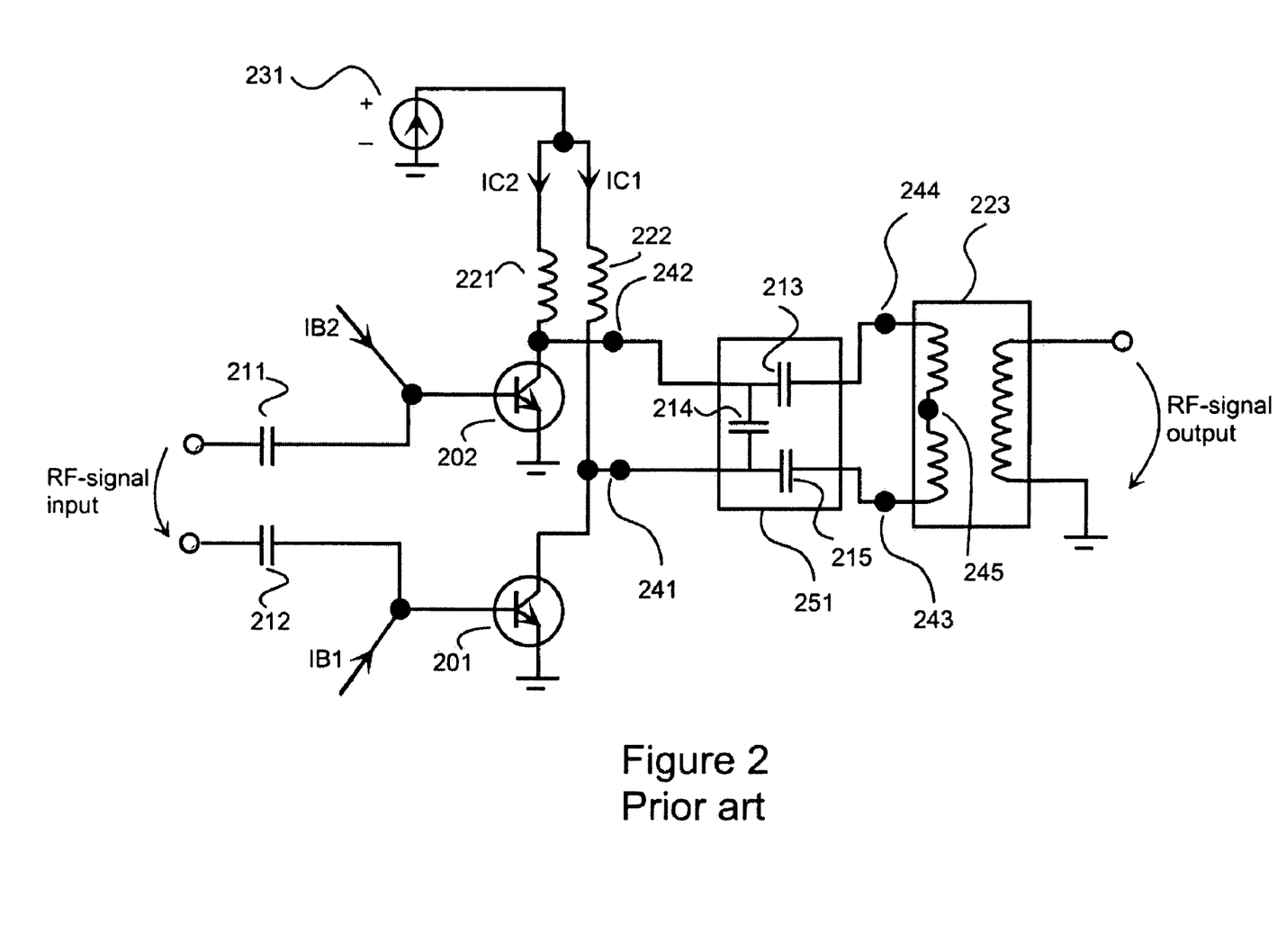
FIG. 2 is a circuit diagram of a push-pull type differential power amplifier according to the prior art.

A broadband push-pull type differential amplifier has the following advantages compared with a single-ended amplifier: high output power (~twice that of a single ended amplifier), cancellation of even harmonics, and high efficiency. A circuit diagram of a prior art power amplifier with a push-pull type active stage is shown in FIG. 2. The RF input signal is coupled to the bases of output stage transistors 201 and 202 through dc-decoupling capacitors 211 and 212. Also base bias currents IB1 and IB2 are fed to the bases of the transistors 201 and 202. The signal output terminals of the transistors (collectors) are fed by dc-currents IC1 and IC2, hereinafter operating point currents, for reaching a desired operating point for the transistors. The operating point currents are fed through inductors 221 and 222 by a dc-voltage source 231. For a push-pull power amplifier to work properly a broadband balanced to unbalanced transformer 223, hereinafter balun, with excellent amplitude and phase balance is needed in a passive stage for transforming the balanced output signal of the push-pull stage to an unbalanced signal. The balun can be realised with microstrip structures, see e.g. reference FI103614. The signal outputs of the transistors, nodes 241 and 242, are connected via an impedance transformer 251 to the input of the balun 223. The RF-output signal is taken out from the output port of the balun.

The output impedance of the push-pull type active stage, i.e. the impedance seen between the nodes 241 and 242 towards transistors, is low, in the order of few ohms. The input impedance of the balun, i.e. the impedance seen between the nodes 243 and 244 towards the balun, is significantly higher. This mismatch between the impedances of the balun and of the push-pull type active stage causes a need for an impedance transformer 251.

The inductors 221 and 222 have to be able to bear all the current taken by the push-pull type active stage. This means that the inductors require a remarkable portion of the total area needed for realizing the system shown in FIG. 2. Many times the inductors have to be realized as discrete components meaning also an increase in the number of components to be assembled in a production line. Briefly speaking the inductors mean costs, a need for space, and power losses.

A known solution for avoiding the need for the inductors 221 and 222 is to feed the operating point currents IC1 and IC2 through the balun 223 and, thus, to use the inductances of the balun for series inductors for the transistors. This is accomplished by coupling the dc-voltage source 231 with the node 245 in balun 223. With this approach the impedance transformer 251 has to be such that operating point currents are able to flow through it. This target turns out to be difficult to reach due to the fact that there is a significant mismatch between the output impedance of the push-pull type active stage and the input impedance of the inductive balun element. The capacitive impedance transformer has to be realized such that the impedance matching is based at least partially on serial resonance. The drawback is the fact that this kind of a serial resonance system is not able to transfer dc-current because of serial capacitors 213 and 215. When using a microstrip balun an attempt to solve this problem would be to lower the impedance level of the balun by broadening and shortening the microstrips of the balun. This would also weaken the inductive coupling between the microstrips on the signal input side and on the signal output side of the balun and, therefore, the attenuation of the balun would become unacceptably high. Another issue is the fact that the balun has to be able to bear all the current taken by the push-pull type active stage. This point is a problem especially when there is an intention of using a microstrip balun integrated into an RF-IC.

SUMMARY OF THE INVENTION

It is an objective of the present invention to provide a new design solution for power amplifiers of the kind described above allowing the drawbacks mentioned above to be eliminated or reduced. It is also an objective of the present invention to provide a method for implementing a power amplifier into an RF-IC, the implemented power amplifier allowing the drawbacks mentioned above to be eliminated or reduced. It is also an objective of the present invention to provide a push-pull type power amplifier in which the operating point currents to the signal output terminals of the output stage transistors may be fed via the balun. Furthermore, it is an objective of the present invention to provide a mobile phone having a power amplifier in which the drawbacks mentioned above are eliminated or reduced.

The objectives of the invention are achieved with a solution in which electrically conductive elements accomplishing an electrical connection between the active part and the passive part of an RF-IC are designed in a way that a number of electrical components performing impedance transformation on a signal path from signal output terminals of the active stage to signal output terminals of the passive stage can be reduced compared with solutions according to prior art. For example, in a push-pull type amplifier the impedance transformation between signal output terminals of the active stage and signal input terminals of a balun may be accomplished without serial capacitors.

Terms 'active part' and 'active stage' and correspondingly terms 'passive part' and 'passive stage' should not be confused with each other. In this document terms 'active part' and 'passive part' mean physical parts of an RF-IC. A term 'active stage' means a subsystem of a power amplifier from RF-input to output terminals of output stage transistors, such as transistors 201 and 202 in FIG. 1. A term 'passive stage' means a subsystem of a power amplifier that is electrically coupled between the active stage and a load of a power amplifier.

The invention yields appreciable benefits compared to prior art solutions:

The number of electrical components performing impedance transformation on a signal path from signal output terminals of an active stage to signal output terminals of a passive stage is reduced. As a consequence, physical size and electrical losses of the amplifier system are reduced and cost efficiency of the system and its manufacturing is improved.

The electrical characteristics of the electrical connection between the active and the passive part of an RF-IC may be designed also to improve low-pass filtering of RF-signal in a cost effective way.

In a push-pull type power amplifier operating point currents may be fed to the power transistors via the signal input side of the balun and via the electrical connection between the active and the passive part of an RF-IC thus making separate inductors unnecessary. As a consequence, the number of electrical components is reduced, the physical size of the amplifier system is reduced, the losses associated with the inductors are avoided, and the cost efficiency of the system is improved. Also in a single-sided amplifier and in a two-sided amplifier with a 90 degrees phase shift operating point current/currents can be transferred via the electrical connection between the active part and the passive part, but a separate inductor/inductors is/are still needed, because there is no balun or a corresponding component that could be used instead of the separate inductor/inductors.

In a push-pull type power amplifier the electrical connection between the active part and the passive part of an RF-IC may also be used as an inductive part to form a balanced low-pass filter in co-operation with a parallel capacitive element. Therefore, the solution of the invention allows a cost effective improvement of the low-pass filtering that is usually needed at the output of a push-pull type active stage.

In a two-sided amplifier with a 90 degrees phase shift the electrical connection between the active part and the passive part of an RF-IC may also be used as an inductive part of a first stage of a hybrid circuit. Therefore, the solution of the invention allows a number of electrical components in the hybrid circuit to be reduced thus leading to improved cost efficiency of the amplifier and its manufacturing.

Briefly, in the solution according to the invention the electrical connection is used not only for transferring the signal from the active part to the passive part but also for impedance transformation. In addition to these, the electrical connection can also be used for one or more of the following: improving low-pass filtering of output signal, transferring operating point current/currents to output stage transistor/transistors, being a part of a hybrid circuit in a case of a two-sided amplifier with a 90 degrees phase shift. When the flip-chip technique shown in FIG. 1 is used for realizing the electrical connection the resistive losses associated with transfer of signal and operating point current/currents can be made low, because strip type conductors on a base plate of an RF-IC can be made of copper having high electrical conductivity. Furthermore, thickness and width of a conductor can be chosen within relatively free limits.

A power amplifier according to the invention, comprising
an active stage,
a passive stage being electrically coupled between the active stage
and a load of the power amplifier;

the power amplifier being integrated into an integrated circuit, hereinafter RF-IC, comprising a base plate, an active part comprising a signal output, a passive part comprising a signal input, and electrically conductive elements for connecting the signal output of the active part to the signal input of the passive part, is characterised in that the electrically conductive elements are disposed to perform at least part of impedance transformation on a signal path from signal output terminals of the active stage to signal output terminals of the passive stage.

A method according to the invention for implementing a power amplifier into an integrated circuit, hereinafter RF-IC, comprising a base plate, an active part, a passive part, and electrically conductive elements for connecting the active part to the passive part is characterised in that the method comprises designing electromagnetic properties of the electrically conductive elements in a way that impedance transformation on a signal path from signal output terminals of an active stage of the power amplifier to signal output terminals of a passive stage of the power amplifier is at least partially performed by the electrically conductive elements.

A mobile phone according to the invention, comprising
a power amplifier comprising an active stage and a passive stage, the passive stage being electrically coupled between the active stage and a load of the power amplifier;

the power amplifier being integrated into an integrated circuit, hereinafter RF-IC, comprising a base plate, an active part comprising a signal output, a passive part comprising a signal input, and electrically conductive elements for connecting the signal output of the active part to the signal input of the passive part, is characterised in that the electrically conductive elements are disposed to perform at least part of impedance transformation on a signal path from signal output terminals of the active stage to signal output terminals of the passive stage.

Features of various advantageous embodiments of the invention are listed in the appended depending claims.

The exemplary embodiments of the invention presented in this document are not to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF FIGURES

The invention and its other advantages are explained in greater detail below with reference to the accompanying drawings, in which.

FIGS. 1 and 2 have been explained above in the description of the prior art.

DESCRIPTION OF THE PREFERRED EMBODIMENTS

Figure 3:
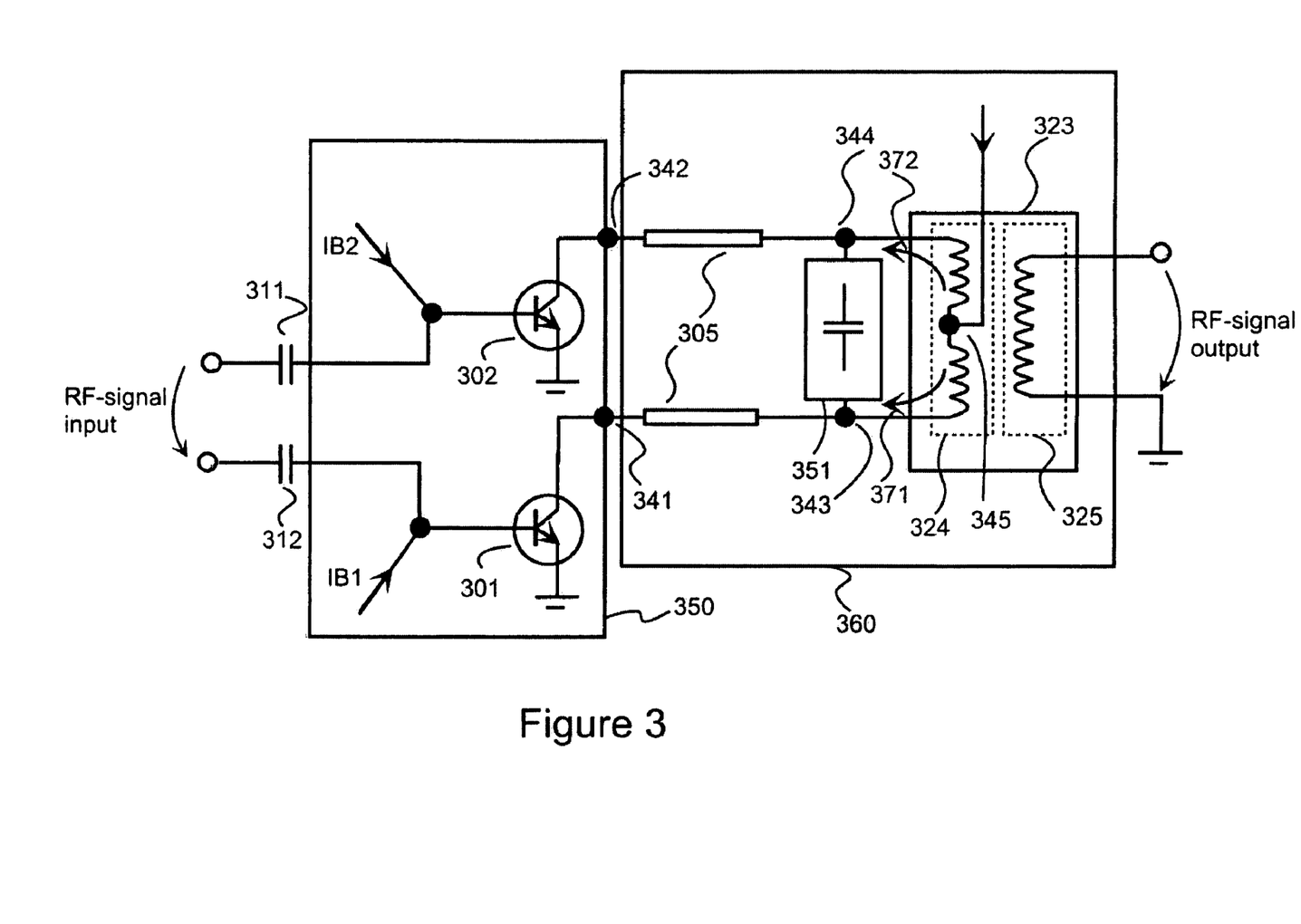
FIG. 3 is a circuit diagram of a push-pull type differential power amplifier according to one embodiment of the invention.

FIG. 3 presents a circuit diagram of a differential power amplifier according to an embodiment of the invention using a push-pull type active stage 350. The push-pull type active stage 350 is located in an active part of an RF-IC. A passive stage 360 is located partly on a base plate and partly in a passive part of an RF-IC. A need for separate inductors for operating point currents to be fed to signal output terminals (e.g. collectors) of transistors 301 and 302 has been avoided by using a signal input side 324 of a balun 323 for the functionality of separate inductors. The balun 323 is located in the passive part of the RF-IC. A signal output 341, 342 of the active part has been connected to a signal input 343, 344 of the passive part via electrically conductive elements 305. In this description the means for coupling the electrically conducting wires or strips to the active part and to the passive part are seen to be included in the electrically conductive elements 305. The means for coupling may comprise e.g. solder bumps in a case of the flip-chip technique. Operating point currents 371 and 372 for the output stage transistors 301 and 302 are fed via the signal input side 324 of the balun 323 and via the electrically conductive elements 305. The method for generating the operating point currents is immaterial from the viewpoint of this invention; in FIG. 3 we simply assume that there is a coupling from some current generating source to a middle node 345 of the signal input side 324 of the balun 323.

The electrically conductive elements 305 are designed in a way that the impedance level seen from the balun 323 towards the push-pull type active stage 350 is so high that the impedance matching can be accomplished with a capacitive parallel-connected element 351, and thus, a need for serial capacitors is avoided. The electrically conductive elements 305 may be realized by e.g. with the flip-chip technique as shown in FIG. 1 or with the wire-bonding technique or with some other technique. A system consisting of the electrically conductive elements 305 and the capacitive parallel element 351 acts also as a balanced low-pass filter that is usually needed at the output of a push-pull type active stage. The impedance level seen from the balun 323 towards the push-pull type active stage 350 is adjusted by a proper choice of manufacturing materials and geometrical properties of conductors of the electrically conductive elements 305 and/or of the electrically and/or magnetically conductive elements within the proximity of the conductors; e.g. the length of the conductors, the mutual distance between them, the width of a conductive strip if the flip-chip technique is used. The geometrical properties producing the desired impedance level may be obtained e.g. with prototype experiments and measurements. This embodiment of the invention can be distinguished from prior art systems on a basis of the fact that in this embodiment of the invention:

electrical conductors from the active part to the passive part are not as short as possible but they are made to meander in order to increase inductance and/or capacitance of the conductors, and/or the mutual distance between the two electrical conductors is not constant along the conductors, and/or width of a strip conductor of a flip-chip structure is not constant along the conductor, but the conductor is wider at a first end connected to the active part than at a second end connected to the passive part, in order to make the strip to have a lower impedance at the first end than at the second end.

A mobile phone according to this embodiment of the invention is such that a power amplifier described above and in FIG. 3 is used for amplifying an RF-signal in the mobile phone.

Figure 4:
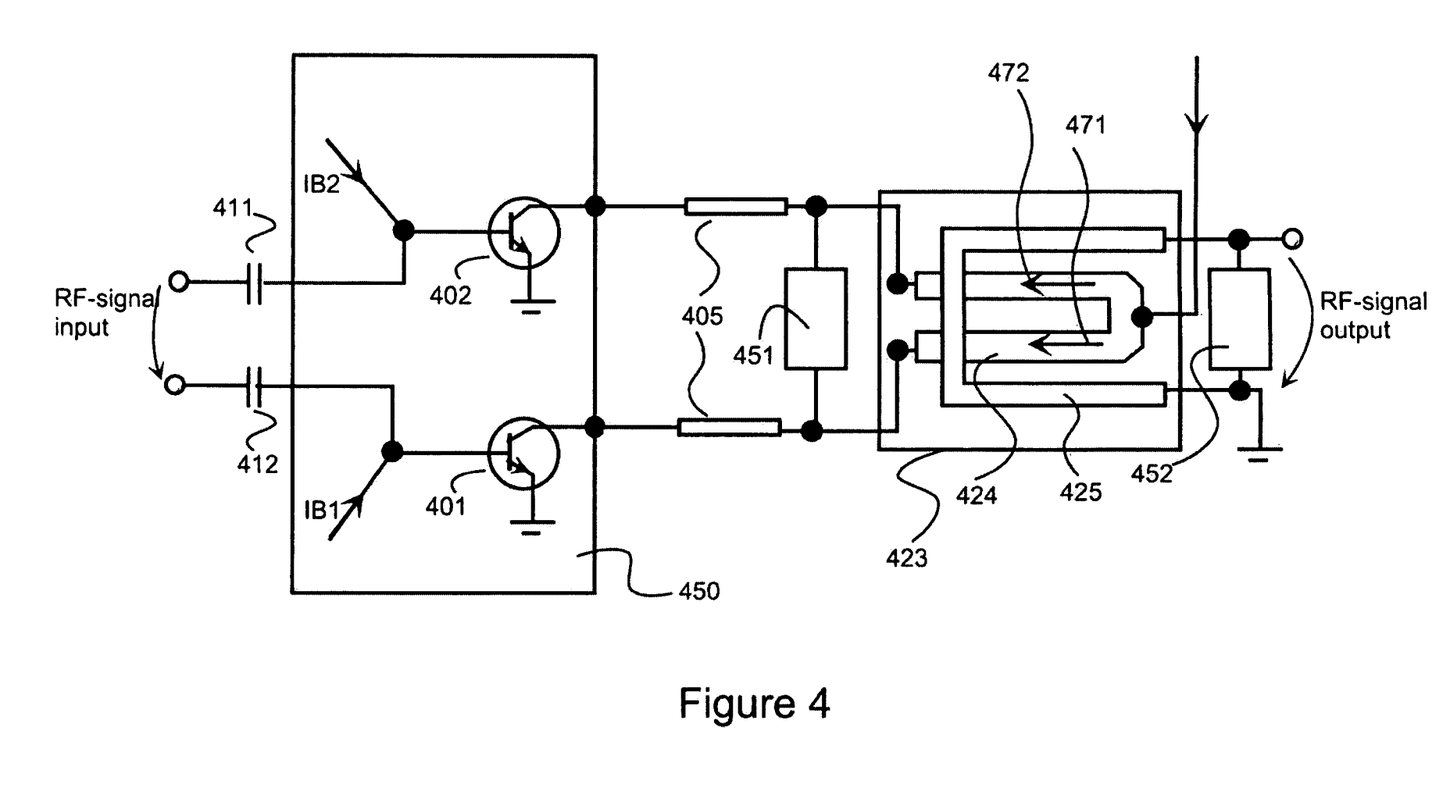
FIG. 4 is a circuit diagram of a push-pull type differential power amplifier according to another embodiment of the invention.

An advantageous embodiment of the invention is shown in FIG. 4. In this embodiment of the invention, a signal input side and a signal output side of a balun 423 are realized with electrically conductive microstrips 424 and 425. The balun comprises also an electrically conductive ground plane, not shown in FIG. 4, that is common for both the microstrips 424 and 425. In the signal input side an RF-signal propagates in a form of electromagnetic fields between the microstrip 424 and the ground plane. The RF-current flowing in the microstrip 424 produces an alternating magnetic field that induces a corresponding RF-signal in the microstrip 425. The induced RF-signal propagates in a form of electromagnetic fields between the microstrip 425 and the ground plane.

The electrically conductive microstrips 424 and 425 forming the signal input side and the signal output side of the balun are integral parts of the passive part, and the electrically conductive ground plane is an integral part of the base plate. An electrically conductive microstrip is an integral part of the passive part in a way that the electrically conductive microstrip is located totally or partly inside the passive part, or in a way that the electrically conductive microstrip is located on a surface of the passive part. The electrically conductive ground plane is an integral part of the base plate according to the same principle.

The distance from the electrically conductive microstrips 424 and 425 to the electrically conductive ground plane can be made substantially longer than that of microstrip structures according to the prior art in which an electrically conductive microstrip and a ground plane are separated by a layer of insulator. The thickness of the insulator layer is limited because of reasons associated with the manufacturing processes. In certain cases the maximum reachable distance may be as low as 10 µm. The distance from the electrically conductive microstrips 424 and 425 to the electrically conductive ground plane is determined by the geometrical properties of the passive part, of the base plate, and of elements located between the passive part and the base plate. The elements between the base plate and the passive part may be, for example, solder bumps that are acting as signal paths as shown in FIG. 1. It is also possible that the elements are dedicated spacer elements the only purpose of them being to make a distance between the passive part and the base plate. Such spacers that do not act as signal paths may be made of various materials. For example, they may be realized in a form of elevated areas on a surface of the passive part and/or on a surface of the base plate. In some cases the distance from the electrically conductive microstrips 424 and 425 to the electrically conductive ground plane can be arranged without any spacing means between the base plate and the passive part. The electrically conductive microstrips 424 and 425 and/or the ground plane may be located in the passive part and/or in the base plate, respectively, in a way that a sufficient distance is achieved even if no spacing means are used.

The operating point currents 471 and 472 for the output stage transistors 401 and 402 are fed via the microstrip 424 in the signal input side of the balun 423 and via the electrically conductive elements 405. The system consisting of the electrically conductive elements 405 and the capacitive parallel element 451 acts also as a balanced low-pass filter.

Figure 5A:
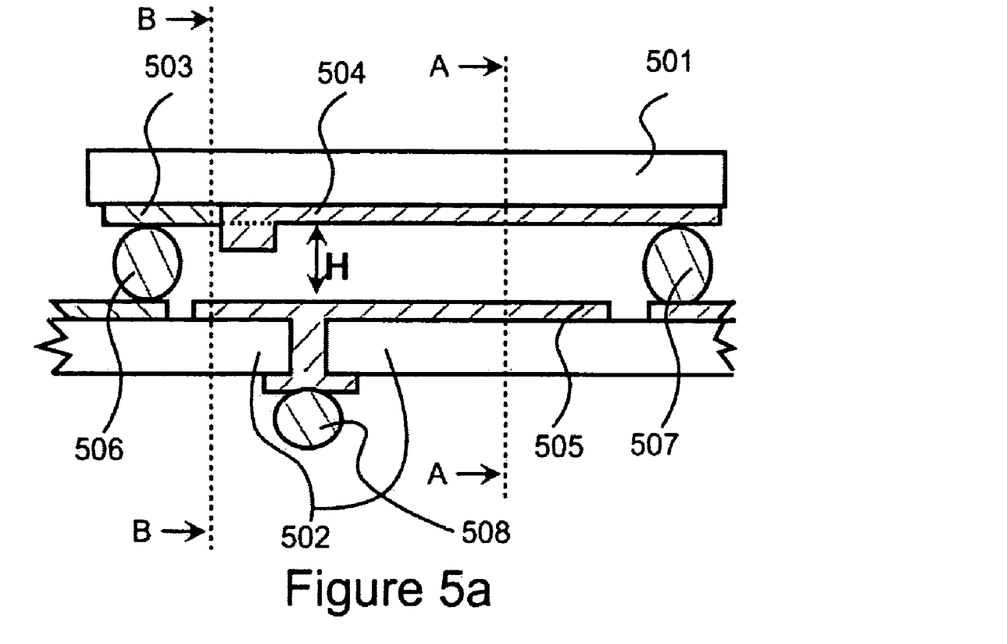
FIGS. 5a, 5b, 5c and 5d present an exemplary arrangement of the microstrip conductors and the ground plane for them in the balanced to unbalanced transformer used in a system according to FIG. 4.
Figure 5B:
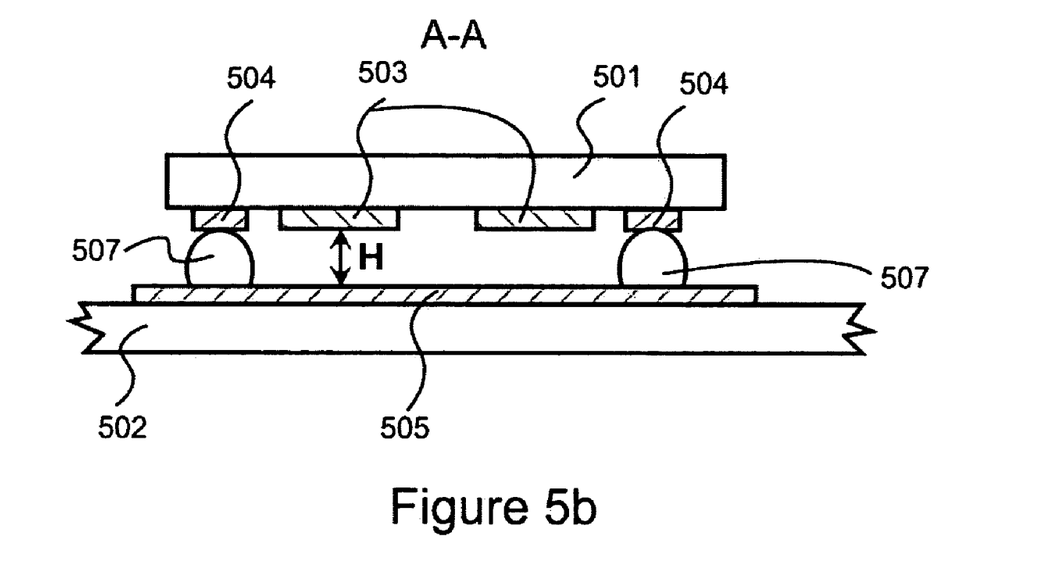
Figure 5C:
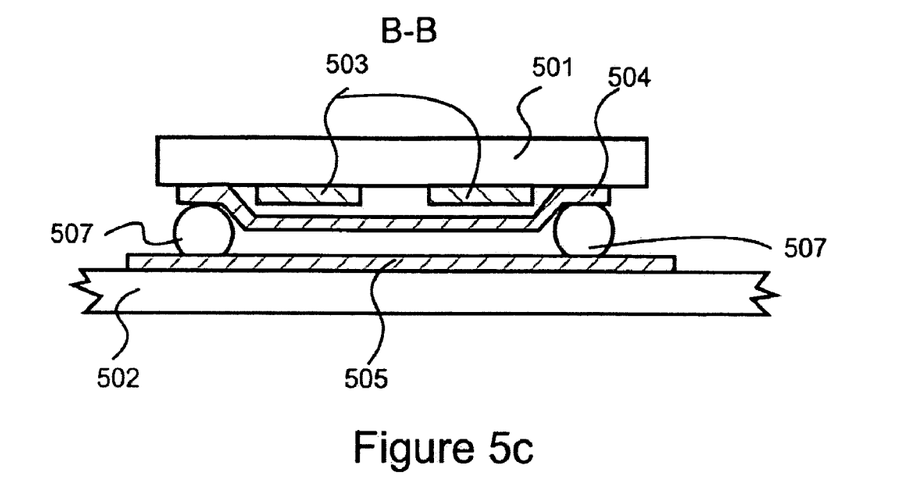
Figure 5D:
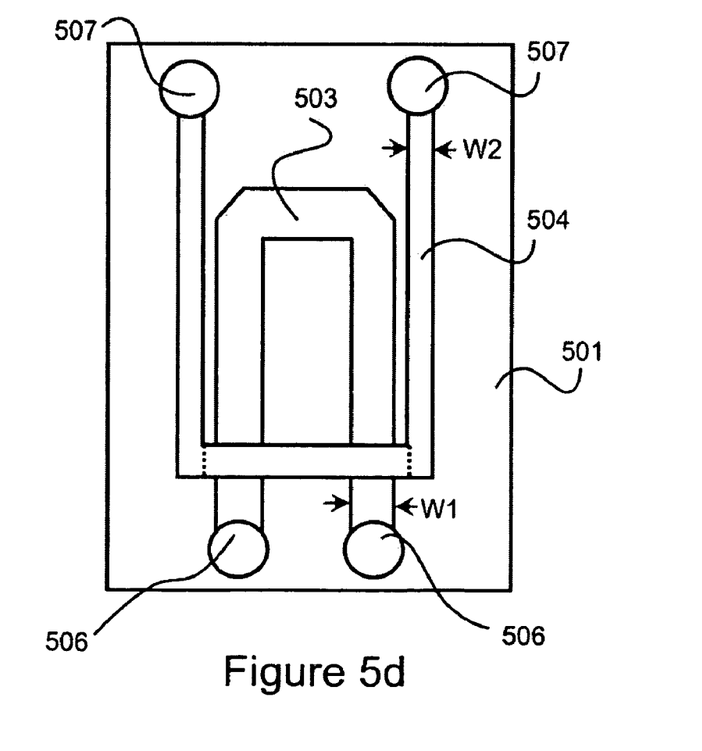

FIGS. 5a, 5b, 5c and 5d present an exemplary balun construction used in this embodiment of the invention. FIG. 5a presents a side view of the passive part 501 of an RF-IC and a piece of the base plate 502 of an RF-IC to which microstrips 503 and 504 and a ground plane 505 have been arranged to form a balun. The cross section A-A marked in FIG. 5a is presented in FIG. 5b and the cross-section B-B marked in FIG. 5a is presented in FIG. 5c. A bottom view of the passive part 501 with microstrips 503 and 504 is shown in FIG. 6d. As seen from FIG. 5c it is possible that there are microstrips in more than one layer.

In the arrangement shown in FIGS. 5a, 5b, 5c, and 5d the distance H from the microstrips 503 and 504 to the ground plane 505 is determined by solder bumps 506 and 507 that may also act as signal paths. Thanks to the sufficient distance from the microstrips 503 and 504 to the ground plane 505 the widths of the microstrips 503 and 504, W1 and W2, may be selected so that the desired electrical properties are achieved: sufficient inductive coupling between the signal input side and the signal output side, desired impedance levels at the signal input side and at the signal output side, ability to carry the operating point currents 471 and 472 with a power loss small enough, and desired filtering properties in co-operation with the parallel capacitive elements 451 and 452, the balun acting as an inductive element in the filtering function.

The ground plane 505 may be connected via a solder bump 508 to a ground of the circuit board the RF-IC is mounted on, and utilizing this, an electrical connection between the ground plane 505 and the active part and/or the passive part may be arranged. The material in the space between the microstrips 503 and 504 and the ground plane 505 may be e.g. air, so the dielectrical losses in that material can be minimized. It is, however, possible to use other underfill material if the manufacturing process requires it.

In a case that the active part and the passive part are electrically connected to each other and/or to the base plate by using e.g. the wire bonding technique and a certain spacing is still desired between the passive part and the base plate, it is possible to use dedicated spacer elements between the passive part and the base plate. Naturally, such spacers that are not used as signal paths may be made of various materials.

A mobile phone according to this embodiment of the invention is such that a power amplifier described above and in FIGS. 4 and 5 is used for amplifying an RF-signal in the mobile phone.

Figure 6:
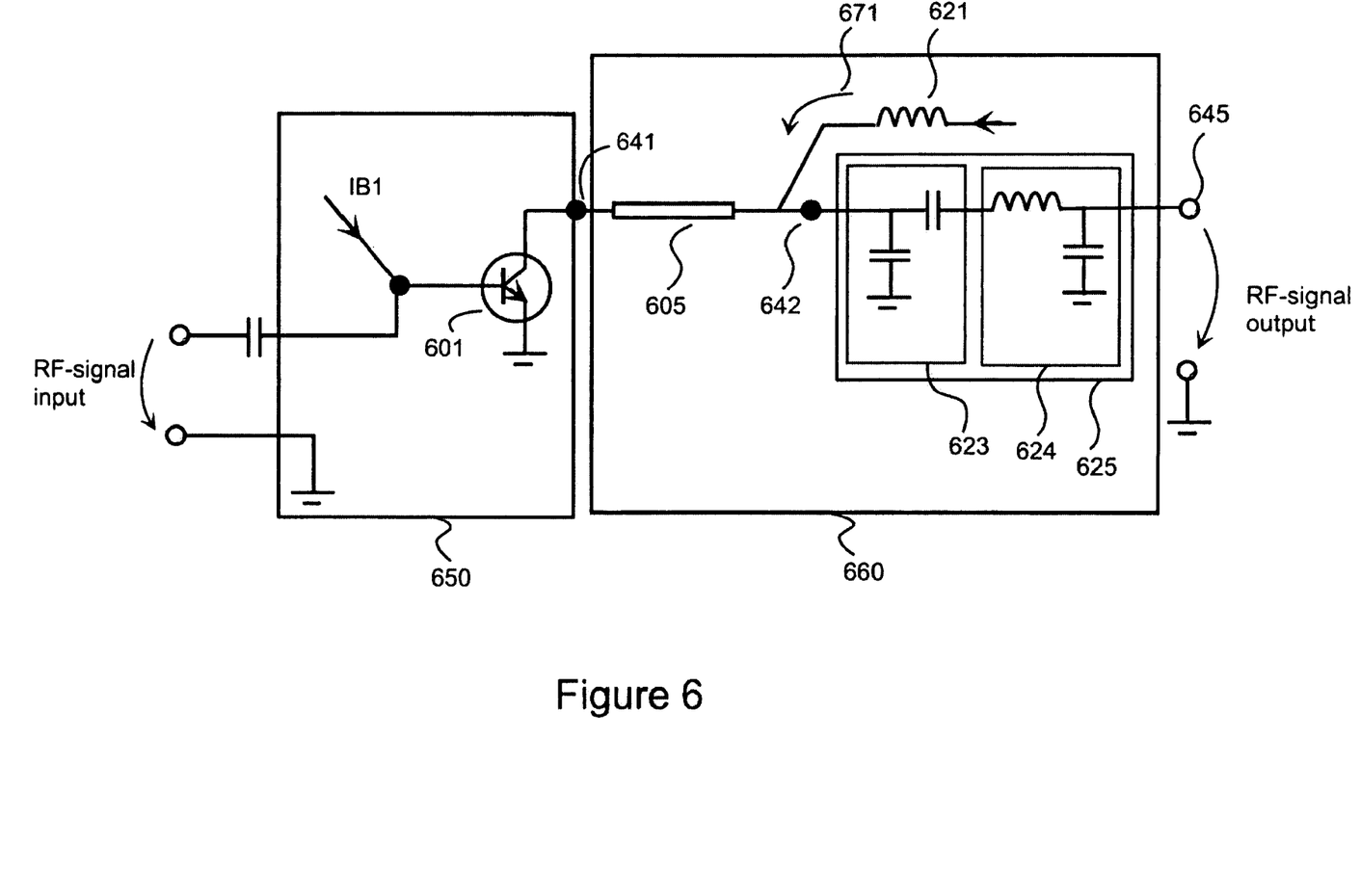
FIG. 6 is a circuit diagram of a single-sided power amplifier according to one embodiment of the invention.

FIG. 6 presents a circuit diagram of a power amplifier according to an embodiment of the invention using a single-sided active stage 650. The active stage 650 is located in an active part of an RF-IC. A passive stage 660 comprises electrically conductive elements 605 and an impedance matching and low-pass filtering circuit 625 having two successive stages 623 and 624. The passive stage 660 is located partly on a base plate and partly in a passive part of an RF-IC. A signal output 641 of the active part has been connected to a signal input 642 of the passive part via the electrically conductive elements 605, wherein a signal ground acts as a return path. In this description the means for coupling the electrically conducting wire or strip to the active part and to the passive part are seen to be included in the electrically conductive elements 605. The means for coupling may comprise e.g. solder bumps in a case of the flip-chip technique. Operating point current 671 for the output stage transistor 601 is fed via an inductor 621 and via the electrically conductive elements 605. The method for generating the operating point current 671 is immaterial from the viewpoint of this invention.

The electrically conductive elements 605 are designed in a way that the inductance of the electrically conductive elements 605 can be used as an inductance needed for the first stage 623 of the impedance matching and low-pass filtering circuit 625. Therefore, impedance transformation on a signal path from signal output terminals of the active stage to signal output terminals 645 of the passive stage is at least partially performed by the electrically conductive elements 605 and the electrically conductive elements 605 act as a part of a system that performs at least one of the following: impedance transformation on the above mentioned signal path, low-pass filtering. The electrically conductive elements 605 may be realized by e.g. with the flip-chip technique as shown in FIG. 1 or with the wire-bonding technique or with some other technique. The impedance seen from terminal 642 towards the active stage 650 is adjusted by a proper choice of manufacturing materials and geometrical properties of a conductor of the electrically conductive elements and/or of the electrically and/or magnetically conductive elements within the proximity of the conductor; e.g. the length of the conductor, the distance between the conductor and a signal ground, the width of a conductive strip if the flip-chip technique is used. This embodiment of the invention can be distinguished from prior art systems on a basis of the fact that in this embodiment of the invention:

the electrical conductor carrying RF-signal from the active part to the passive part is not as short as possible but it is made to meander in order to increase inductance and/or capacitance of the conductor, and/or the mutual distance between the electrical conductor and a conductor representing the signal ground is not constant along the conductor, and/or width of a strip conductor of a flip-chip structure is not constant along the conductor, but the conductor is wider at a first end connected to the active part than at a second end connected to the passive part, in order to make the strip to have a lower impedance at the first end than at the second end.

A mobile phone according to this embodiment of the invention is such that a power amplifier described above and in FIG. 6 is used for amplifying an RF-signal in the mobile phone.

Figure 7:
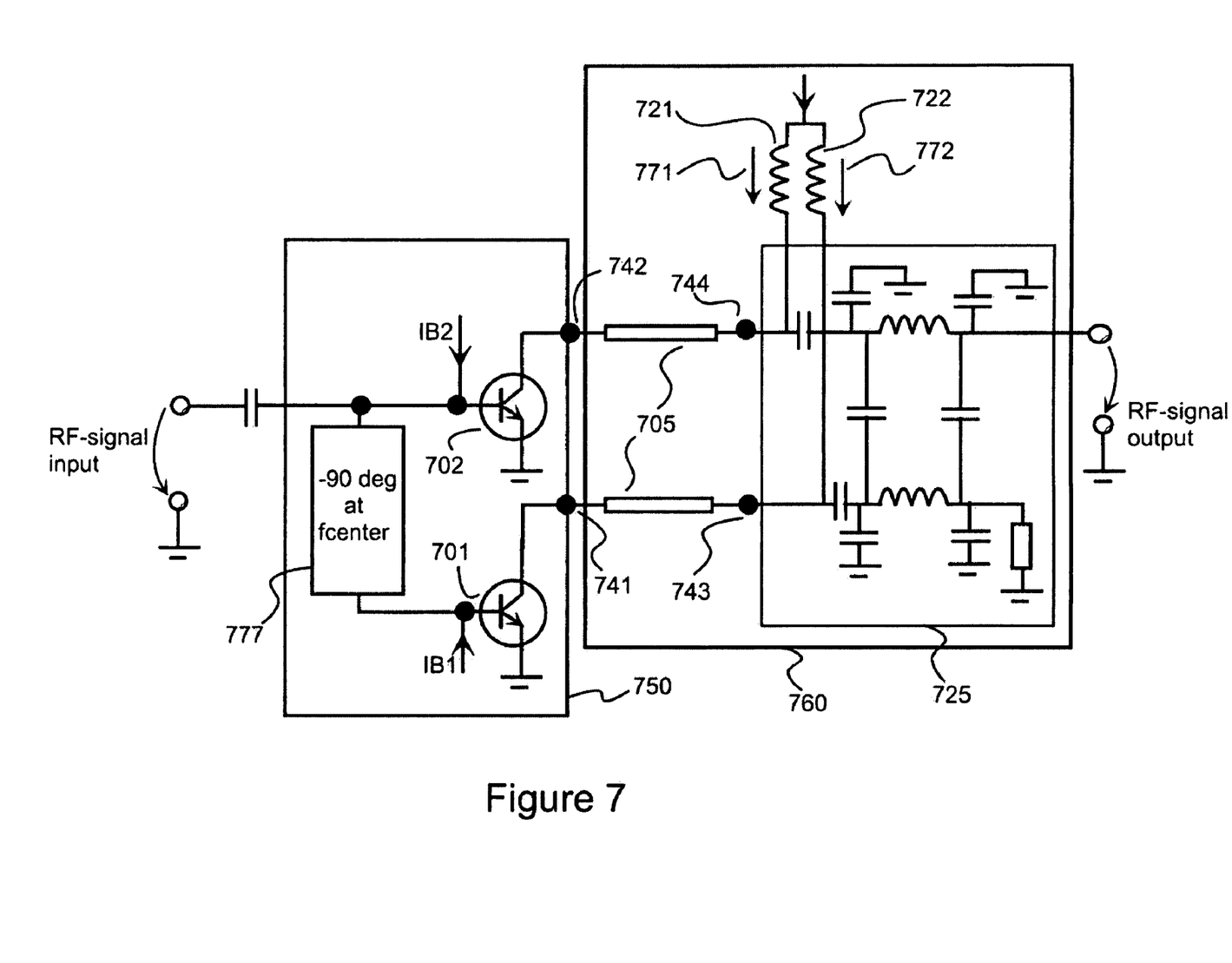
FIG. 7 is a circuit diagram of a two-sided power amplifier with a 90 degrees phase shift according to one embodiment of the invention.

FIG. 7 presents a circuit diagram of a two-sided power amplifier according to an embodiment of the invention using a two-sided active stage with a 90 degrees phase shift 750. Element 777 delays the input RF-signal so that there is a 90 degrees phase difference in the input signals of the output stage transistors 701 and 702 at a centre frequency of a signal band. The active stage 750 is located in an active part of an RF-IC. A passive stage 760 comprises electrically conductive elements 705 and a circuit 725 for combining RF-signals from different sides of the two-sided active stage, for impedance transformation, and for low-pass filtering. The passive stage 760 is located partly on a base plate and partly in a passive part of an RF-IC. A signal output 741, 742 of the active part has been connected to a signal input 743, 744 of the passive part via the electrically conductive elements 705. Operating point currents 771 and 772 for the output stage transistors 701 and 702 are fed via inductors 721 and 722 and via the electrically conductive elements 705.

The electrically conductive elements 705 are designed in a way that the electrically conductive elements act as a part of a system that performs at least one of the following: combination of RF-signals from different sides of the two-sided active stage, impedance transformation on a signal path from signal output terminals of the active stage to signal output terminal of the passive stage, low-pass filtering. Therefore, impedance transformation on a signal path from the output terminals of the active stage to the output terminals of the passive stage is at least partially performed by the electrically conductive elements 705. This embodiment of the invention can be distinguished from prior art systems on a basis of the fact that in this embodiment of the invention:

electrical conductors of the electrically conductive elements 750 from the active part to the passive part are not as short as possible but they are made to meander in order to increase inductance and/or capacitance of the conductors, and/or the mutual distance between the two electrical conductors is not constant along the conductors, and/or width of a strip conductor of a flip-chip structure is not constant along the conductor, but the conductor is wider at a first end connected to the active part than at a second end connected to the passive part, in order to make the strip to have a lower impedance at the first end than at the second end.

A mobile phone according to this embodiment of the invention is such that a power amplifier described above and in FIG. 7 is used for amplifying an RF-signal in the mobile phone.

A method for implementing a power amplifier into an RF-IC comprises designing electromagnetic properties of the electrically conductive elements (305) in a way that impedance transformation on a signal path from signal output terminals of the a active stage (350) to signal output terminals of the passive stage (360) is at least partially performed by the electrically conductive elements (305).

The designing the electromagnetic properties of the electrically conductive elements (305) may be accomplished by sizing geometrical dimensions and by selecting the manufacturing materials for the electrically conductive elements (305), electrically and magnetically conductive elements within the RF-electromagnetic proximity of the electrically conductive elements (305), electrically conductive elements within the RF-electromagnetic proximity of the electrically conductive elements (305), magnetically conductive elements within the RF-electromagnetic proximity of the electrically conductive elements (305), where the term 'RF-electromagnetic proximity' means such a surroundings of the electrically conductive elements (305) inside which there may be electromagnetic interactions at RF-frequencies having an influence on the impedance level seen from the signal input side of the balun towards the push-pull active stage. For example, magnetically conductive material increases the inductance of a near electrical conductor.

In a case that the electrically conductive elements (305) are realized with the flip-chip technique the sizing the geometrical dimensions of the electrically conductive elements (305) means selecting lengths, widths, thicknesses, mutual distance of conductors, and shapes of routes of conductors. Correspondingly, in a case that the electrically conductive elements (305) are realized with the wire-bonding technique the sizing the geometrical dimensions of the electrically conductive elements (305) means selecting lengths, thicknesses, mutual distance of conductors, and shapes of routes of conductors.

The impedances of the electrically conductive microstrips forming the signal input side and the signal output side of the balun can be determined within certain limits by selecting the widths of the electrically conductive microstrips.

What is claimed is:

1. A power amplifier, comprising:
   an active stage that is a subsystem of the power amplifier from a radio frequency input terminal to output terminals of output stage transistors,
   a passive stage that is a subsystem of the power amplifier that is electrically coupled between the active stage and a load of the power amplifier;
   the power amplifier being integrated into an integrated circuit that comprises the following physical parts: a base plate, an active part comprising a signal output, a passive part comprising a signal input, and electrically conductive elements for connecting the signal output of the active part to the signal input of the passive part, wherein the electrically conductive elements are disposed to perform at least part of impedance transformation on a signal path from signal output terminals of the active stage to signal output terminals of the passive stage.

2. A power amplifier according to claim 1, wherein the active stage is a two-sided active stage with a 90 degrees phase shift.

3. A power amplifier according to claim 2, wherein the electrically conductive elements are disposed to act as a part of a system performing at least one of the following: combination of radio frequency-signals from different sides of the two-sided active stage, impedance transformation on a signal path from the signal output terminals of the active stage to the signal output terminals of the passive stage, low-pass filtering.

4. A power amplifier according to claim 1, wherein the active stage is a single-sided active stage.

5. A power amplifier according to claim 4, wherein the electrically conductive elements are disposed to act as a part of a system performing at least one of the following: impedance transformation on a signal path from the signal output terminals of the active stage to the signal output terminals of the passive stage, low-pass filtering.

6. A power amplifier according to claim 1, wherein the active stage is a push-pull type active stage and the passive stage comprises a balanced to unbalanced transformer, hereinafter balun, comprising an electrical conductor forming a signal input side of the balun and an electrical conductor forming a signal output side of the balun.

7. A power amplifier according to claim 6, wherein the power amplifier comprises a capacitive element in parallel with the signal input side of the balun, and the electrically conductive elements are disposed to perform the impedance transformation in co-operation with said capacitive element.

8. A power amplifier according to claim 6, wherein the electrical conductor forming the signal input side of the balun and the electrically conductive elements are disposed to conduct operating point currents received at a middle node of the signal input side of the balun to signal output terminals of output stage transistors of the push-pull type active stage.

9. A power amplifier according to claim 6, wherein the balun comprises an electrically conductive ground plane common for both the signal input side and the signal output side of the balun, and
   the electrical conductor forming the signal input side of the balun is an electrically conductive microstrip that is an integral part of the passive part, and
   the electrical conductor forming the signal output side of the balun is an electrically conductive microstrip that is an integral part of the passive part, and
   the electrically conductive ground plane of the balun is an integral part of the base plate.

10. A power amplifier according to claim 9, wherein said electrically conductive microstrip forming the signal input side of the balun and said electrically conductive microstrip forming the signal output side of the balun are located on a surface of the passive part that faces towards the base plate and, said electrically conductive ground plane of the balun is located on a surface of the base plate that faces towards the passive part.

11. A power amplifier according to claim 9, wherein said electrically conductive ground plane of the balun is electrically connected with a ground of a circuit board.

12. A power amplifier according to claim 1, wherein the electrically conductive elements are realized with the flip-chip technique.

13. A power amplifier according to claim 1, wherein the electrically conductive elements are realized with the wire-bonding technique.

14. A power amplifier according to claim 9, wherein the distance between the passive part and the base plate is determined by solder bumps between the passive part and the base plate.

15. A power amplifier according to claim 9, comprising one or more spacer elements for determining the distance between the passive part and the base plate.

16. A power amplifier according to claim 9, wherein a surface of the passive part comprises one or more elevated areas for determining the distance between said electrically conductive microstrips and said electrically conductive ground plane.

17. A power amplifier according to claim 9, wherein a surface of the base plate comprises one or more elevated areas for determining the distance between said electrically conductive microstrips and said electrically conductive ground plane.

18. A power amplifier according to claim 6, wherein the power amplifier comprises a capacitive element in parallel with the signal input side of the balun, and the electrically conductive elements between the active and the passive part of the integrated circuit are disposed to form a balanced low-pass filter in co-operation with said capacitive elements.

19. A method for implementing a power amplifier into an integrated circuit comprising the following physical parts of the integrated circuit: a base plate, an active part, a passive part, and electrically conductive elements for connecting the active part to the passive part, wherein the method comprises designing electromagnetic properties of the electrically conductive elements in a way that impedance transformation on a signal path from signal output terminals of an active stage that is a subsystem of the power amplifier to signal output terminals of a passive stage that is a subsystem of the power amplifier is at least partially performed by the electrically conductive elements.

20. A method according to claim 19, wherein the designing the electromagnetic properties of the electrically conductive elements comprises sizing geometrical dimensions for at least one of the following
the electrically conductive elements,
electrically and magnetically conductive elements within the radio frequency-electromagnetic proximity of the electrically conductive elements,
electrically conductive elements within the radio frequency-electromagnetic proximity of the electrically conductive elements,
magnetically conductive elements within the radio frequency-electromagnetic proximity of the electrically conductive elements.

21. A method according to claim 20, wherein the method comprises realizing the electrically conductive elements with a flip-chip technique and the sizing said geometrical dimensions of the electrically conductive elements comprises selecting lengths, widths, thicknesses, mutual distance of conductors, and shapes of routes of conductors.

22. A method according to claim 20, wherein the method comprises realizing the electrically conductive elements with a wire-bonding technique and the sizing said geometrical dimensions of the electrically conductive elements comprises selecting lengths, thicknesses, mutual distance of conductors, and shapes of routes of conductors.

23. A method according to claim 19, wherein the designing the electromagnetic properties of the electrically conductive elements comprises selection of manufacturing materials for at least one of the following
the electrically conductive elements,
electrically and magnetically conductive elements within the radio frequency-electromagnetic proximity of the electrically conductive elements,
electrically conductive elements within the electromagnetic radio frequency-proximity of the electrically conductive elements,
magnetically conductive elements within the radio frequency-electromagnetic proximity of the electrically conductive elements.

24. A method according to claim 19, comprising realizing a balanced to unbalanced transformer, hereinafter balun, that comprises an electrically conductive ground plane common for both a signal input side and a signal output side of the balun, and
an electrical conductor forming the signal input side of the balun is an electrically conductive microstrip that is an integral part of the passive part, and
an electrical conductor forming the signal output side of the balun is an electrically conductive microstrip that is an integral part of the passive part, and
the electrically conductive ground plane of the balun is an integral part of the base plate.

25. A method according to claim 24, wherein the impedance of the electrically conductive microstrip forming the signal input side of the balun is determined by selecting the width of the electrically conductive microstrip.

26. A method according to claim 24, wherein the impedance of the electrically conductive microstrip forming a signal output side of the balun is determined by selecting the width of the electrically conductive microstrip.

27. A mobile phone, comprising:
a power amplifier comprising an active stage and a passive stage, the active stage being a subsystem of the power amplifier from a radio frequency signal input terminal to output terminals of output stage transistors and the passive stage being a subsystem of the power amplifier that is electrically coupled between the active stage and a load of the power amplifier;
the power amplifier being integrated into an integrated circuit comprising the following physical parts: a base plate, an active part comprising a signal output, a passive part comprising a signal input, and electrically conductive elements for connecting the signal output of the active part to the signal input of the passive part, wherein the electrically conductive elements are disposed to perform at least part of impedance transformation on a signal path from signal output terminals of the active stage to signal output terminals of the passive stage.

28. A mobile phone according to claim 27, wherein the active stage is a two-sided active stage with a 90 degrees phase shift.

29. A mobile phone according to claim 28, wherein the electrically conductive elements are disposed to act as a part of a system performing at least one of the following: combination of radio frequency-signals from different sides of the two-sided active stage, impedance transformation on a signal path from the signal output terminals of the active stage to the signal output terminals of the passive stage, low-pass filtering.

30. A mobile phone according to claim 27, wherein the active stage is a single-sided active stage.

31. A mobile phone according to claim 30, wherein the electrically conductive elements are disposed to act as a part of a system performing at least one of the following: impedance transformation on a signal path from the signal output terminals of the active stage to the signal output terminals of the passive stage, low-pass filtering.

32. A mobile phone according to claim 27, wherein the active stage is a push-pull type active stage and the passive stage comprises a balanced to unbalanced transformer, hereinafter balun, comprising an electrical conductor forming a signal input side of the balun and an electrical conductor forming a signal output side of the balun.

33. A mobile phone according to claim 32, wherein the power amplifier comprises a capacitive element in parallel with the signal input side of the balun, and the electrically conductive elements are disposed to perform the impedance transformation in co-operation with said capacitive element.

34. A mobile phone according to claim 32, wherein the electrical conductor forming the signal input side of the balun and the electrically conductive elements are disposed to conduct operating point currents received at a middle node of the signal input side of the balun to signal output terminals of output stage transistors of the push-pull type active stage.

35. A mobile phone according to claim 32, wherein the balun comprises an electrically conductive ground plane common for both the signal input side and the signal output side of the balun, and
the electrical conductor forming the signal input side of the balun is an electrically conductive microstrip that is an integral part of the passive part, and
the electrical conductor forming the signal output side of the balun is an electrically conductive microstrip that is an integral part of the passive part, and
the electrically conductive ground plane of the balun is an integral part of the base plate.

36. A mobile phone according to claim 35, wherein said electrically conductive microstrip forming the signal input side of the balun and said electrically conductive microstrip forming the signal output side of the balun are located on a surface of the passive part that faces towards the base plate and, said electrically conductive ground plane of the balun is located on a surface of the base plate that faces towards the passive part.

37. A mobile phone according to claim 35, wherein said electrically conductive ground plane of the balun is electrically connected with a ground of a circuit board.

38. A mobile phone according to claim 27, wherein the electrically conductive elements are realized with the flip-chip technique.

39. A mobile phone according to claim 27, wherein the electrically conductive elements are realized with the wire-bonding technique.

40. A mobile phone according to claim 35, wherein the distance between the passive part and the base plate is determined by solder bumps between the passive part and the base plate.

41. A mobile phone according to claim 35, wherein the power amplifier comprises one or more spacer elements for determining the distance between the passive part and the base plate.

42. A mobile phone according to claim 35, wherein a surface of the passive part comprises one or more elevated areas for determining the distance between said electrically conductive microstrips and said electrically conductive ground plane.

43. A mobile phone according to claim 35, wherein a surface of the base plate comprises one or more elevated areas for determining the distance between said electrically conductive microstrips and said electrically conductive ground plane.

44. A mobile phone according to claim 35, wherein the power amplifier comprises a capacitive element in parallel with the signal input side of the balun, and the electrically conductive elements between the active and the passive part of the integrated circuit are disposed to form a balanced low-pass filter in co-operation with said capacitive elements.

* * * * *